(12) United States Patent
Yan et al.

(10) Patent No.: US 9,304,270 B2
(45) Date of Patent: Apr. 5, 2016

(54) MONOLITHIC OPTICAL COUPLING MODULE BASED ON TOTAL INTERNAL REFLECTION SURFACES

(75) Inventors: Shipeng Yan, Beijing (CN); Yanwu Zhang, Beijing (CN); Dong Pan, Andover, MA (US); Jack Yuan, Saratoga, CA (US)

(73) Assignee: SiFotonics Technologies Co, Ltd., Woburn, MA (US)

( * ) Notice: Subject to any disclaimer, the term of this patent is extended or adjusted under 35 U.S.C. 154(b) by 351 days.

(21) Appl. No.: 13/211,028

(22) Filed: Aug. 16, 2011

(65) Prior Publication Data

US 2012/0193522 A1 Aug. 2, 2012

Related U.S. Application Data

(60) Provisional application No. 61/462,334, filed on Feb. 1, 2011.

(51) Int. Cl.
| | |
|---|---|
| *G06M 7/00* | (2006.01) |
| *H01J 5/16* | (2006.01) |
| *H01L 31/00* | (2006.01) |
| *G02B 6/42* | (2006.01) |

(52) U.S. Cl.
CPC .................................. *G02B 6/4286* (2013.01)
USPC .......................... 250/221; 250/216; 250/214.1

(58) Field of Classification Search
USPC .............. 250/221, 222.1, 227.28, 239, 214.1, 250/216; 257/431–435; 359/618; 385/14, 385/49
See application file for complete search history.

(56) References Cited

U.S. PATENT DOCUMENTS

| | | | | |
|---|---|---|---|---|
| 4,400,054 A | * | 8/1983 | Biard et al. | ...................... 385/36 |
| 6,842,571 B2 | * | 1/2005 | Kramer et al. | .................. 385/47 |

* cited by examiner

*Primary Examiner* — Kevin Pyo
*Assistant Examiner* — Don Williams
(74) *Attorney, Agent, or Firm* — Han IP Corporation

(57) ABSTRACT

In one aspect, an optical device comprises a monolithic optical module which includes a first total internal reflection (TIR) surface, a second TIR surface adjacent the first TIR surface, and a first optical port aligned with the first internal optical beam dividing interface. An interface between the first TIR surface and the second TIR surface forms a first internal optical beam dividing interface. An exterior surface of the first TIR surface and an exterior surface of the second TIR surface form a generally V-shaped notch on the monolithic optical module. A first optical beam entering the monolithic optical module through the first optical port and incident on the first internal optical beam dividing interface is partially reflected by the first TIR surface to travel in a first direction as a second optical beam and partially reflected by the second TIR surface to travel in a second direction as a third optical beam. The second direction is generally opposite to the first direction.

20 Claims, 7 Drawing Sheets

MONOLITHIC OPTICAL COUPLING MODULE BASED ON TOTAL INTERNAL REFLECTION SURFACES

CROSS-REFERENCE TO RELATED PATENT APPLICATIONS

This application claims priority to U.S. Patent Application Ser. No. 61/462,334, entitled "Monolithic Optical Coupling Module Based on Two Contiguous Total Internal Reflection Surfaces", filed on Feb. 1, 2011, which is herein incorporated in its entirety by reference.

BACKGROUND

1. Technical Field

The present disclosure relates to an optical device and assembly thereof. More particularly, the present disclosure relates to an optical device with optical splitting route.

2. Description of Related Art

When packaging vertical-cavity surface-emitting lasers (VCSEL), a tilted glass reflective mirror is typically used to reflect part of the emitted light to a monitor photodetector (MPD) lying beside the VCSEL. Referring to FIG. 1 which illustrates a conventional VCSEL assembly, several components are required, such as transistor outline (TO)-header, TO-cap with light splitting glass, barrel, and lens etc., which make the assembly complex and expensive. U.S. Pat. No. 6,888,988 proposes a monolithic all-polymer module, such as that shown in FIG. 2, to simplify package process and reduce cost. The light splitting function is based on an air-gap in polymer. However, the splitting ratio cannot be easily adjusted and the splitting ratio is often polarization-sensitive, since the reflectivity is different for transverse electric (TE) and transverse magnetic (TM) light when light is reflected by a tilted surface.

Therefore, there is a need for a design of optical devices that allows arbitrary splitting ratio to be easily implemented, simplifies assembly process, reduces the number of assembly components, and saves assembly cost.

SUMMARY

The present disclosure provides various embodiments of a low-cost monolithic optical coupling module that simplifies assembly process, reduces the number of assembly components, and saves assembly cost. The design of the disclosed embodiments allows arbitrary splitting ratio to be easily implemented.

According to one aspect, an optical device may comprise a monolithic optical module which includes a first total internal reflection (TIR) surface, a second TIR surface adjacent the first TIR surface, and a first optical port aligned with the first internal optical beam dividing interface. An interface between the first TIR surface and the second TIR surface may form a first internal optical beam dividing interface. An exterior surface of the first TIR surface and an exterior surface of the second TIR surface may form a generally V-shaped notch on the monolithic optical module. A first optical beam entering the monolithic optical module through the first optical port and incident on the first internal optical beam dividing interface may be partially reflected by the first TIR surface to travel in a first direction as a second optical beam and partially reflected by the second TIR surface to travel in a second direction as a third optical beam. The second direction may be generally opposite to the first direction.

An optical beam splitting ratio of the monolithic optical module may be predetermined according to at least one physical feature of at least one of the first TIR surface and the second TIR surface.

The monolithic optical module may be made of polymer.

In one embodiment, the monolithic optical module may further comprise a second optical port aligned with the first TIR surface such that the second optical beam exits the monolithic optical module through the second optical port.

In another embodiment, the monolithic optical module may further comprise a third TIR surface and a third optical port aligned with the third TIR surface. The third optical beam may be at least partially reflected by the third TIR surface to travel in a third direction as a fourth optical beam. The fourth optical beam may exit the monolithic optical module through the third optical port. The monolithic optical module may additionally comprise a fourth TIR surface and a fourth optical port aligned with the fourth TIR surface. A portion of the third optical beam traveling in the second direction and not reflected by the third TIR surface may be reflected by the fourth TIR surface to travel in a fourth direction as a fifth optical beam. The fifth optical beam may exit the monolithic optical module through the fourth optical port.

In one embodiment, the optical device may further comprise a light source aligned with the first optical port. The light source may emit the first optical beam that enters the monolithic optical module through the first optical port.

In another embodiment, the optical device may further comprise an optical fiber coupled to the second optical port such that the second optical beam exiting the monolithic optical module through the second optical port may be coupled into the optical fiber.

In yet another embodiment, the optical device may further comprise a first monitor photodetector aligned with the third optical port. The first monitor photodetector may detect the fourth optical beam when the fourth optical beam exits the monolithic optical module through the third optical port.

In still another embodiment, the optical device may further comprise a second monitor photodetector aligned with the fourth optical port. The second monitor photodetector may detect the fifth optical beam when the fifth optical beam exits the monolithic optical module through the fourth optical port.

According to another aspect, an optical device may comprise a monolithic optical module that comprises a first TIR surface, a second TIR surface, and a third TIR surface. An interface between the first TIR surface and the second TIR surface may form an internal optical beam dividing interface. The internal optical beam dividing interface may divide a first optical beam incident on the internal optical beam dividing interface into a second optical beam and a third optical beam. The second optical beam may be reflected by the first TIR surface to travel in a first direction. The third optical beam may be reflected by the second TIR surface to travel in a second direction. At least a portion of the third optical beam may be reflected by the third TIR surface to travel in a third direction as a fourth optical beam.

An optical beam splitting ratio of the monolithic optical module may be predetermined according to at least one physical feature of at least one of the first TIR surface, the second TIR surface, and the third TIR surface.

In one embodiment, the monolithic optical module may further comprise a first optical port, a second optical port, and a third optical port. The first optical port may be aligned with the first internal optical beam dividing interface such that when the first optical beam enters the monolithic optical module through the first optical port is incident on the internal optical beam dividing interface and divided into the second optical beam and the third optical beam. The second optical port may be aligned with the first TIR surface such that the second optical beam exits the monolithic optical module through the second optical port. The third optical port may be aligned with the third TIR surface such that the fourth optical beam exits the monolithic optical module through the third optical port.

In another embodiment, the monolithic optical module may further comprise a fourth TIR surface and a fourth optical port aligned with the fourth TIR surface. A portion of the third optical beam traveling in the second direction and not reflected by the third TIR surface may be reflected by the fourth TIR surface to travel in a fourth direction as a fifth optical beam. The fifth optical beam may exit the monolithic optical module through the fourth optical port.

According to still another aspect, an optical device may comprise a monolithic optical module that comprises a first TIR surface and a second TIR surface. A first optical beam incident on the first TIR surface may be reflected by the first TIR surface to travel in a first direction as a second optical beam such that a first portion of the second optical beam is reflected by the second TIR surface to travel in a second direction as a third optical beam while a second portion of the second optical beam is not reflected by the second TIR surface and continues to travel in the first direction as a fourth optical beam.

An optical beam splitting ratio of the monolithic optical module may be predetermined according to at least one physical feature of at least one of the first TIR surface and the second TIR surface.

In one embodiment, the monolithic optical module may further comprise a first optical port, a second optical port, and a third optical port. The first optical beam may be incident on the first TIR surface when the first optical beam enters the monolithic optical module through the first optical port. The third optical beam may exit the monolithic optical module through the second optical port. The fourth optical beam may exit the monolithic optical module through the third optical port.

In one embodiment, the optical device may further comprise a light source aligned with the first optical port. The light source may emit the first optical beam that enters the monolithic optical module through the first optical port.

In another embodiment, the optical device may further comprise a monitor photodetector aligned with the second optical port. The monitor photodetector may detect the third optical beam when the third optical beam exits the monolithic optical module through the second optical port.

In yet another embodiment, the optical device may further comprise an optical fiber coupled to the third optical port such that the fourth optical beam exiting the monolithic optical module through the third optical port is coupled into the optical fiber.

These and other features, aspects, and advantages of the present disclosure will be explained below with reference to the following figures. It is to be understood that both the foregoing general description and the following detailed description are by examples, and are intended to provide further explanation of the present disclosure as claimed.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure.

DETAILED DESCRIPTION OF THE PREFERRED EMBODIMENTS

Overview

The present disclosure provides an optical device that includes a monolithic optical module. A portion of the light emitted from a light source, such as a VCSEL, is reflected by two or more total internal reflection (TIR) surfaces before being coupled to an optical fiber. At least one other portion of the light emitted from the light source is reflected to a monitor photodetector (MPD). The light splitting ratio between that directed to the optical fiber and that directed to the MPD is predetermined to meet specific requirements according to the physical features, e.g., shape and/or orientation, of the two or more TIR surfaces. Since the optical reflectivity at the two or more TIR surfaces may be 100%, the light splitting ratio between the two or more TIR surfaces is insensitive to light polarization. With this design, the light emitted from the light source can be split to two or more MPDs.

The monolithic optical module provided by the present disclosure may be injection-molded and may be all-polymer. No additional parts are necessary to achieve the optical turns and light splitting as the design relies on the combination of two or more TIR surfaces. Accordingly, this design advantageously results in less assembly components, less complexity for packaging, and lower manufacturing cost.

Moreover, arbitrary splitting ratio can be designed and implemented in a monolithic module in accordance with the present disclosure. The conventional approach splits light with air gap faces polarization dependent loss (PDL) problem when with >20% splitting ratio. In order to use such an optical module with >20% light splitting ratio, some output light must be dropped using dyed material or rough output surface. In contrast, embodiments of the present disclosure can achieve arbitrary splitting ratio, and the splitting ratio is polarization insensitive.

Exemplary Embodiments

Figure 1:
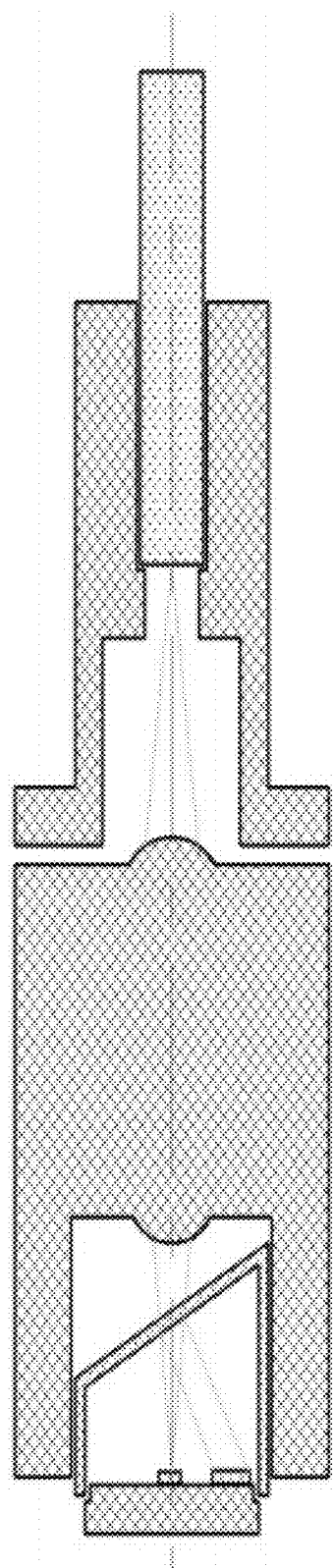
FIG. 1 illustrates a cross-sectional view of a conventional VCSEL assembly.
Figure 2:
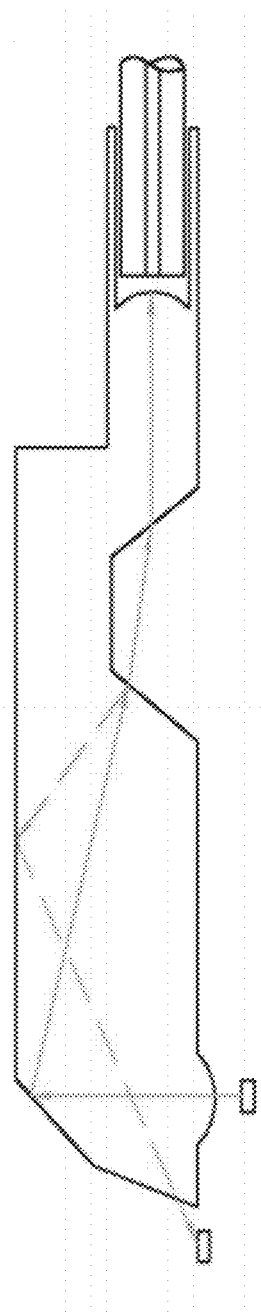
FIG. 2 illustrates a cross-sectional view of another conventional VCSEL assembly.
Figure 3:
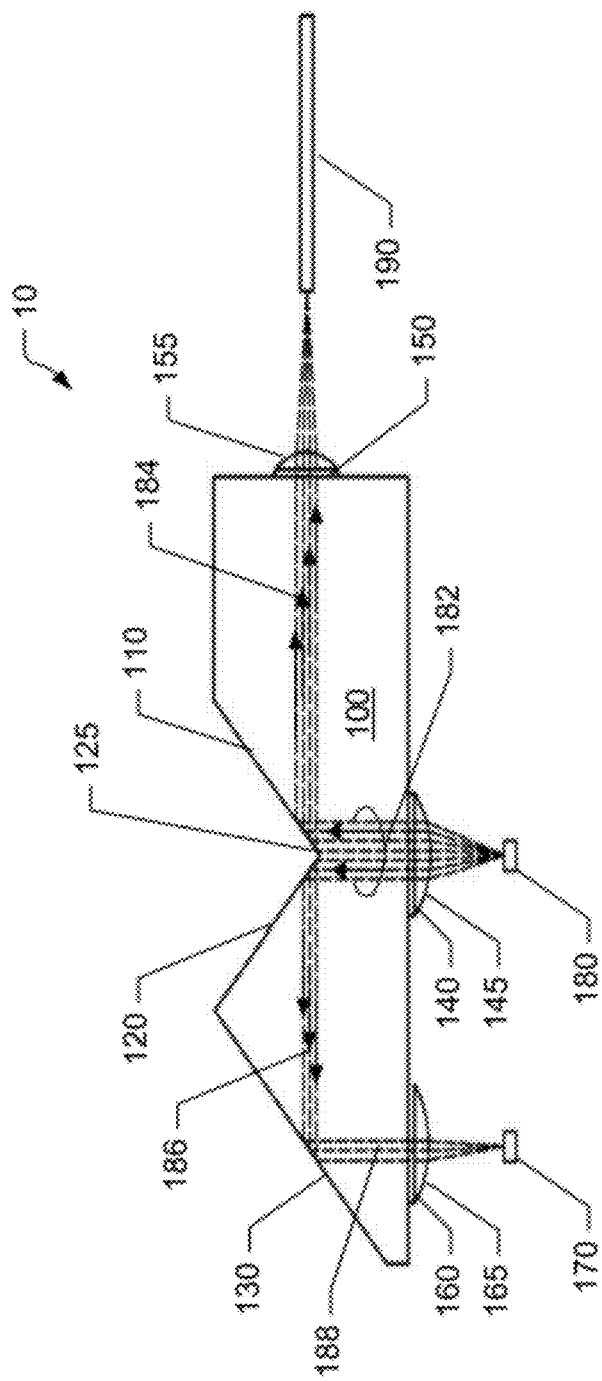
FIG. 3 illustrates a cross-sectional view of an optical device in accordance with an embodiment of the present disclosure.

FIG. 3 illustrates a cross-sectional view of an optical device 10 in accordance with an embodiment of the present disclosure.

The optical device 10 comprises a monolithic optical module 100 that comprises a first TIR surface 110, a second TIR surface 120 that is adjacent the first TIR surface 110, and a third TIR surface 130 that is adjacent, or next to, the second TIR surface 120. The second TIR surface 120 is disposed between the first TIR surface 110 and the third TIR surface 130. An interface between the first TIR surface 110 and the second TIR surface 120 forms a first internal optical beam dividing interface 125. As shown in FIG. 3, the exterior of the first TIR surface 110 and the exterior of the second TIR surface 120 form a generally V-shaped notch on the monolithic optical module 100.

The monolithic optical module 100 also comprises a first optical port 140, a second optical port 150, and a third optical port 160.

The first optical port 140 is aligned with the first internal optical beam dividing interface 125. A first optical beam 182 entering the monolithic optical module 100 through the first optical port 140 and incident on the first internal optical beam dividing interface 125 may be partially reflected by the first TIR surface 110 to travel in a first direction as a second optical beam 184 and partially reflected by the second TIR surface 120 to travel in a second direction as a third optical beam 186. The second direction may be generally opposite to the first direction.

The second optical port 150 is aligned with the first TIR surface 110 such that the second optical beam 184 exits the monolithic optical module 100 through the second optical port 150.

The third optical port 160 is aligned with the third TIR surface 130. The third optical beam 186 may be at least partially reflected by the third TIR surface 130 to travel in a third direction as a fourth optical beam 188. The fourth optical beam 188 may exit the monolithic optical module 100 through the third optical port 160.

In one embodiment, the optical device 10 may further comprise a light source 180 aligned with the first optical port 140. The light source 180 may emit the first optical beam 182 that enters the monolithic optical module 100 through the first optical port 140. The light source 180 may be, for example, a VCSEL, a light-emitting diode (LED), a laser diode or the like.

In another embodiment, the optical device 10 may further comprise an optical fiber 190 coupled to the second optical port 150 such that the second optical beam 184 exiting the monolithic optical module 100 through the second optical port 150 may be coupled into the optical fiber 190.

In yet another embodiment, the optical device 10 may further comprise a first monitor photodetector 170 aligned with the third optical port 160. The first monitor photodetector 170 may detect the fourth optical beam 188 when the fourth optical beam 188 exits the monolithic optical module 100 through the third optical port 160.

An optical beam splitting ratio of the monolithic optical module 100 may be predetermined according to at least one physical feature, e.g., shape and/or orientation, of at least one of the first TIR surface 110 and the second TIR surface 120.

In one embodiment, the monolithic optical module 100 may be made of polymer. In other words, the monolithic optical module 100 may be an all-polymer monolithic optical module.

In one embodiment, the optical device 10 may further comprises a first collimating lens 145 coupled to collimate an optical beam that enters or exits the monolithic optical module 100 through the first optical port 140, a second collimating lens 155 coupled to collimate an optical beam that enters or exits the monolithic optical module 100 through the second optical port 150, and a third collimating lens 165 coupled to collimate an optical beam that enters or exits the monolithic optical module 100 through the third optical port 160.

In the example illustrated in FIG. 3, the light source 180 emits a first optical beam 182. The first optical beam 182 enters the monolithic optical module 100 through the first optical port 140, after being collimated by the first collimating lens 145, to be incident on the first internal optical beam dividing interface 125. Consequently, the first optical beam 182 is divided into the second optical beam 184 traveling in the first direction and a third optical beam 186 traveling in the second direction that is generally opposite to the first direction. The third optical beam 186 is incident on the third TIR surface 130 which turns the third optical beam 186 through an angle to travel in the third direction to exit the monolithic optical module 100 through the third optical port 160 to be collimated by the third collimating lens 165 and detected by the first monitor photodetector 170. The second optical beam 184 exits the monolithic optical module 100 through the second optical port 150 to be collimated by the second collimating lens 155 and coupled into the optical fiber 190.

Figure 4:
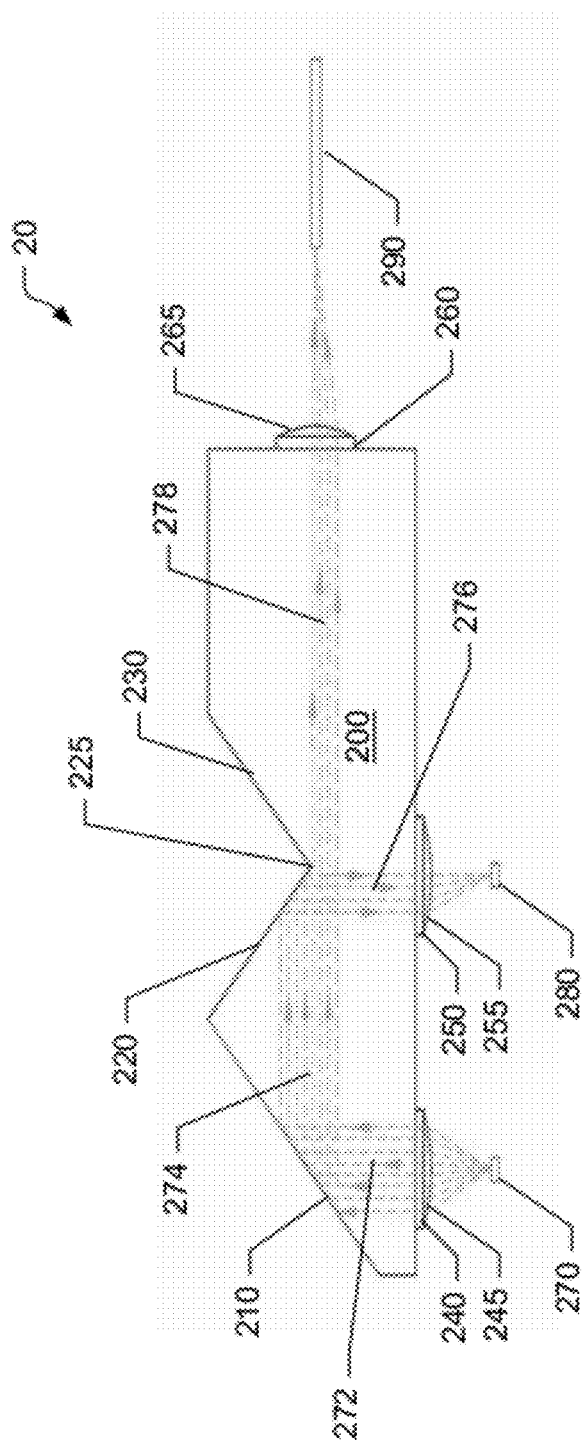
FIG. 4 illustrates a cross-sectional view of an optical device in accordance with another embodiment of the present disclosure.

FIG. 4 illustrates a cross-sectional view of an optical device 20 in accordance with another embodiment of the present disclosure.

The optical device 20 comprises a monolithic optical module 200 that comprises a first TIR surface 210 and a second TIR surface 220. A first optical beam 272 incident on the first TIR surface 210 may be reflected by the first TIR surface 210 to travel in a first direction as a second optical beam 274 such that a first portion of the second optical beam 274 is reflected by the second TIR surface 220 to travel in a second direction as a third optical beam 276 while a second portion of the second optical beam 274 is not reflected by the second TIR surface 220 and continues to travel in the first direction as a fourth optical beam 278.

In one embodiment, the monolithic optical module 200 further comprises a surface 230 that is next to the second TIR surface 220, with the second TIR surface 220 being between the first TIR surface 210 and the surface 230. The surface 230 may be a TIR surface in some embodiments but not a TIR surface in other embodiments. As shown in FIG. 4, the exterior of the second TIR surface 220 and the exterior of the third TIR surface 230 form a generally V-shaped notch on the monolithic optical module 200.

An optical beam splitting ratio of the monolithic optical module 200 may be predetermined according to at least one physical feature of at least one of the first TIR surface 210 and the second TIR surface 220.

In one embodiment, the monolithic optical module 200 may further comprise a first optical port 240, a second optical port 250, and a third optical port 260. The first optical beam 272 is incident on the first TIR surface 210 when the first optical beam 272 enters the monolithic optical module 200 through the first optical port 240. The third optical beam 276 exits the monolithic optical module 200 through the second optical port 250. The fourth optical beam 278 exits the monolithic optical module 200 through the third optical port 260.

In one embodiment, the optical device 20 may further comprise a light source 270 aligned with the first optical port 240. The light source 270 may emit the first optical beam 272 that enters the monolithic optical module 200 through the first optical port 240. The light source 270 may be, for example, a VCSEL, an LED, a laser diode or the like.

In another embodiment, the optical device 20 may further comprise a monitor photodetector 280 aligned with the second optical port 250. The monitor photodetector 280 may detect the third optical beam 276 when the third optical beam 276 exits the monolithic optical module 200 through the second optical port 250.

In yet another embodiment, the optical device 20 may further comprise an optical fiber 290 coupled to the third optical port 260 such that the fourth optical beam 278 exiting the monolithic optical module 200 through the third optical port 260 is coupled into the optical fiber 290.

In one embodiment, the optical device 20 may further comprise a first collimating lens 245, a second collimating lens 255, and a third collimating lens 265. The first collimating lens 245 collimates the first optical beam 272 before the first optical beam 272 enters the monolithic optical module 200 through the first optical port 240. The second collimating lens 255 collimates the third optical beam 276 after the third optical beam 276 exits the monolithic optical module 200 through the second optical port 250. The third collimating lens 265 collimates the fourth optical beam 278 after the fourth optical beam 278 exits the monolithic optical module 200 and before the fourth optical beam 278 is coupled into the optical fiber 290.

In one embodiment, the monolithic optical module 200 may be made of polymer. In other words, the monolithic optical module 200 may be an all-polymer monolithic optical module.

Figure 5:
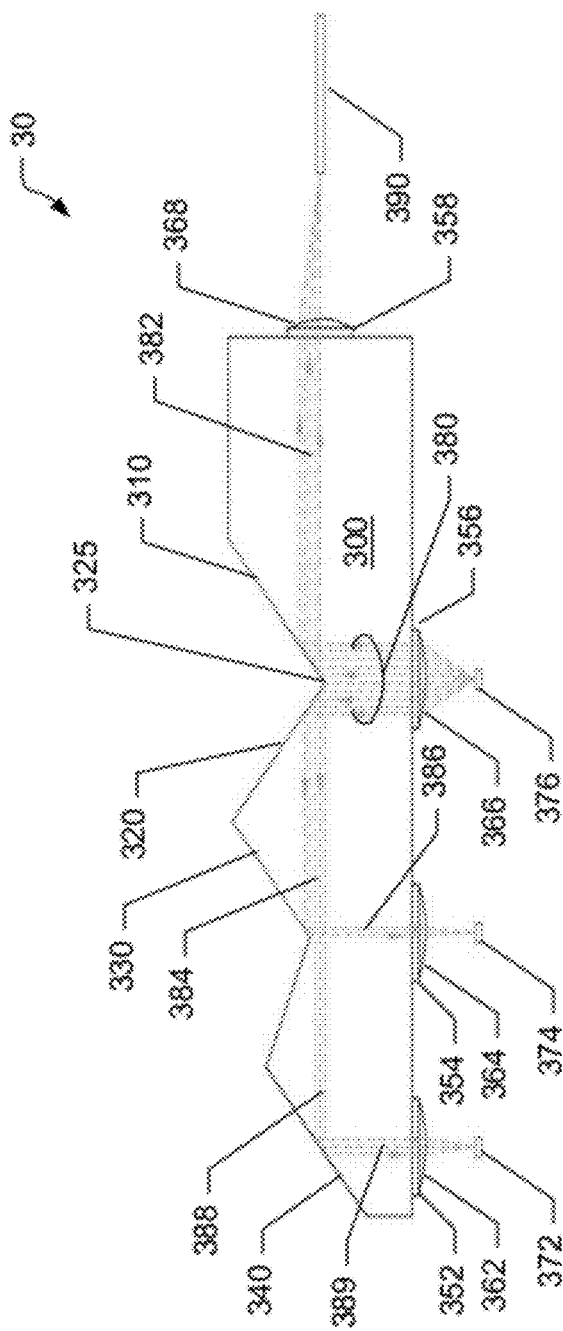
FIG. 5 illustrates a cross-sectional view of an optical device in accordance with yet another embodiment of the present disclosure.

FIG. 5 illustrates a cross-sectional view of an optical device 30 in accordance with another embodiment of the present disclosure.

The optical device 30 comprises a monolithic optical module 300 that comprises a first TIR surface 310, a second TIR surface 320 that is adjacent the first TIR surface 310, and a third TIR surface 330 that is adjacent, or next to, the second TIR surface 320. The second TIR surface 320 is disposed between the first TIR surface 310 and the third TIR surface 330. An interface between the first TIR surface 310 and the second TIR surface 320 forms a first internal optical beam dividing interface 325. As shown in FIG. 5, the exterior of the first TIR surface 310 and the exterior of the second TIR surface 320 form a generally V-shaped notch on the monolithic optical module 300.

The monolithic optical module 300 also comprises a first optical port 356, a second optical port 358, and a third optical port 354.

The first optical port 356 is aligned with the first internal optical beam dividing interface 325. A first optical beam 380 entering the monolithic optical module 300 through the first optical port 356 and incident on the first internal optical beam dividing interface 325 may be partially reflected by the first TIR surface 310 to travel in a first direction as a second optical beam 382 and partially reflected by the second TIR surface 320 to travel in a second direction as a third optical beam 384. The second direction may be generally opposite to the first direction.

The second optical port 358 is aligned with the first TIR surface 310 such that the second optical beam 382 exits the monolithic optical module 300 through the second optical port 358.

The third optical port 354 is aligned with the third TIR surface 330. The third optical beam 384 may be at least partially reflected by the third TIR surface 330 to travel in a third direction as a fourth optical beam 386. The fourth optical beam 386 may exit the monolithic optical module 300 through the third optical port 354.

As shown in FIG. 5, the monolithic optical module 300 may further comprise a fourth TIR surface 340 and a fourth optical port 352 that is aligned with the fourth TIR surface 340. A portion of the third optical beam 384 traveling in the second direction and not reflected by the third TIR surface 330 continues to travel in the second direction as a fifth optical beam 388. The fifth optical beam 388 may be reflected by the fourth TIR surface 340 to travel in a fourth direction as a sixth optical beam 389. The sixth optical beam 389 may exit the monolithic optical module 300 through the fourth optical port 352.

In one embodiment, the optical device 30 may further comprise a light source 376 aligned with the first optical port 356. The light source 376 may emit the first optical beam 380 that enters the monolithic optical module 300 through the first optical port 356. The light source 376 may be, for example, a VCSEL, an LED, a laser diode or the like.

In another embodiment, the optical device 30 may further comprise an optical fiber 390 coupled to the second optical port 358 such that the second optical beam 382 exiting the monolithic optical module 300 through the second optical port 358 may be coupled into the optical fiber 390.

In yet another embodiment, the optical device 30 may further comprise a first monitor photodetector 374 aligned with the third optical port 354. The first monitor photodetector 374 may detect the fourth optical beam 386 when the fourth optical beam 386 exits the monolithic optical module 300 through the third optical port 354.

In still another embodiment, the optical device 30 may further comprise a second monitor photodetector 372 aligned with the fourth optical port 352. The second monitor photodetector 372 may detect the sixth optical beam 389 when the sixth optical beam 389 exits the monolithic optical module 300 through the fourth optical port 352.

An optical beam splitting ratio of the monolithic optical module 300 may be predetermined according to at least one physical feature, e.g., shape and/or orientation, of at least one of the first TIR surface 310, the second TIR surface 320, the third TIR surface 330, and the fourth TIR surface 340.

In one embodiment, the monolithic optical module 300 may be made of polymer. In other words, the monolithic optical module 300 may be an all-polymer monolithic optical module.

In one embodiment, the optical device 30 may further comprises a first collimating lens 366 coupled to collimate an optical beam that enters or exits the monolithic optical module 300 through the first optical port 356, a second collimating lens 368 coupled to collimate an optical beam that enters or exits the monolithic optical module 300 through the second optical port 358, a third collimating lens 364 coupled to collimate an optical beam that enters or exits the monolithic optical module 300 through the third optical port 354, and a fourth collimating lens 362 coupled to collimate an optical beam that enters or exits the monolithic optical module 300 through the fourth optical port 352.

In the example illustrated in FIG. 5, the light source 376 emits a first optical beam 380. The first optical beam 380 enters the monolithic optical module 300 through the first optical port 356, after being collimated by the first collimating lens 366, to be incident on the first internal optical beam dividing interface 325. Consequently, the first optical beam 380 is divided into the second optical beam 382 traveling in the first direction and a third optical beam 384 traveling in the second direction that is generally opposite to the first direction. A first portion of the third optical beam 384 is incident on the third TIR surface 330 which turns the third optical beam 384 through an angle to travel in the third direction as the fourth optical beam 386 to exit the monolithic optical module 300 through the third optical port 354 to be collimated by the third collimating lens 364 and detected by the first monitor photodetector 374. A second portion of the third optical beam 384 is not reflected by the third TIR surface 330 and continues to travel in the second direction as the fifth optical beam 388 until it is incident on the fourth TIR surface 340. Upon reflection by the fourth TIR surface 340, the reflected fifth optical beam 388 travels in the fourth direction as the sixth optical beam 389 to exit the monolithic optical module 300 through the fourth optical port 352 to be collimated by the fourth collimating lens 362 and detected by the second monitor photodetector 372. The second optical beam 382 exits the monolithic optical module 300 through the second optical port 358 to be collimated by the second collimating lens 368 and coupled into the optical fiber 390.

Figure 6:
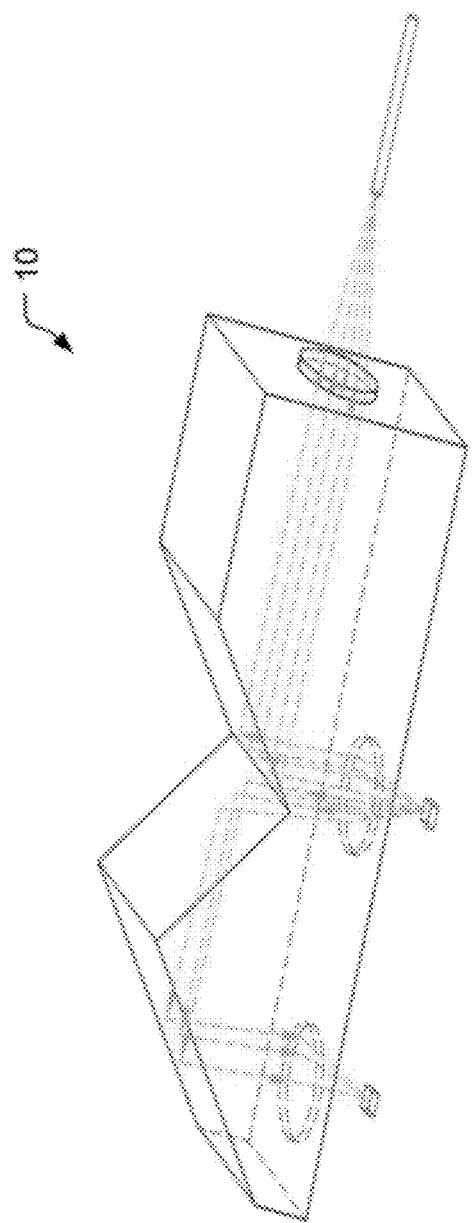
FIG. 6 illustrates a three-dimensional view of an optical device in accordance with an embodiment of the present disclosure.
Figure 7:
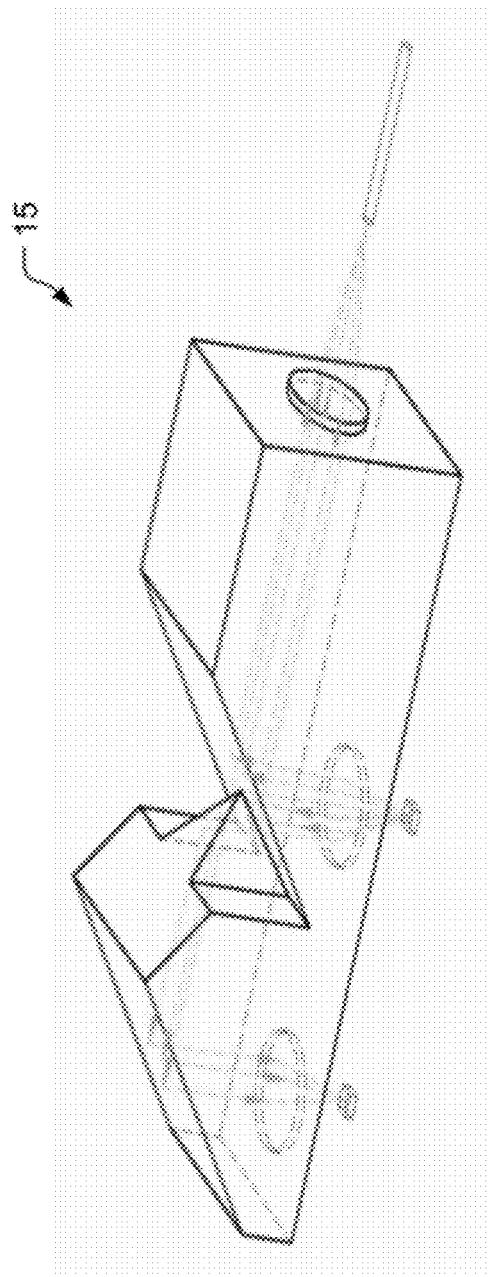
FIG. 7 illustrates a three-dimensional view of an optical device in accordance with another embodiment of the present disclosure.

FIG. 6 illustrates a three-dimensional view of the optical device 10 in accordance with an embodiment of the present disclosure. FIG. 7 illustrates a three-dimensional view of an optical device 15 in accordance with another embodiment of the present disclosure, which may be a variation of the optical device 10 of FIG. 6 in that the exterior surface of one of the TIR surfaces may be of a different shape and that the internal optical beam dividing interface between two adjacent TIR surfaces comprises multiple lines (FIG. 7) instead of a straight line (FIG. 6). FIG. 6 and FIG. 7 show two typical structures to form a three-dimensional structure of the monolithic optical module, and arbitrary splitting ratio can be achieved in both light splitting schemes.

As explained above, an optical beam is reflected by one or more TIR surfaces in the monolithic optical module and eventually split to an optical fiber and one or more monitor photodetectors, as shown in FIGS. 3-5. The light splitting ratio between the optical fiber and the one or more monitor photodetectors can be designed based on the physical features, e.g., shape and/or orientation, of the TIR surfaces. Since the optical reflectivity at the TIR surfaces is 100%, the light splitting ratio between the TIR surfaces is totally insensitive to light polarization. With this design, the light emitted from the light source can be split to one or more monitor photodetectors. In FIG. 5, the light from the light source is split into two monitor photodetectors. If a band-filter is added between one collimating lens and the corresponding monitor photodetector, the wavelength shift can be monitored.

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. An optical device, comprising:
a monolithic optical module that comprises:
a first total internal reflection (TIR) surface;
a second TIR surface adjacent the first TIR surface, an interface between the first TIR surface and the second TIR surface forming a first internal optical beam dividing interface;
a third TIR surface adjacent the second TIR surface;
a fourth TIR surface adjacent the third TIR surface such that the third TIR surface is between the second TIR surface and the fourth TIR surface, an interface between the third TIR surface and the fourth TIR surface forming a second internal optical beam dividing interface, exterior surfaces of the first, the second, the third and the fourth TIR surfaces forming a generally W-shaped contour;
a fifth TIR surface adjacent the fourth TIR surface such that the fourth TIR surface is between the third TIR surface and the fifth TIR surface; and
a first optical port aligned with the first internal optical beam dividing interface such that:

a first optical beam entering the monolithic optical module through the first optical port and incident on the first internal optical beam dividing interface is partially reflected by the first TIR surface to travel in a first direction as a second optical beam and partially reflected by the second TIR surface to travel in a second direction opposite the first direction as a third optical beam, and the third optical beam is incident on the second internal optical beam dividing interface to be partially reflected by the third TIR surface to travel in a third direction different from the first and the second directions as a fourth optical beam, and a part of the third optical beam travels through the second internal optical beam dividing interface without changing direction, then reflected by the fifth TIR surface to travel in a fourth direction different from the first, the second and the third directions as a fifth optical beam.

2. The optical device of claim 1, wherein an optical beam splitting ratio of the monolithic optical module is predetermined according to at least one physical feature of at least one of the first TIR surface and the second TIR surface.

3. The optical device of claim 1, wherein the monolithic optical module is made of polymer.

4. The optical device of claim 1, wherein the monolithic optical module further comprises:
a second optical port aligned with the first TIR surface such that the second optical beam exits the monolithic optical module through the second optical port.

5. The optical device of claim 4, further comprising:
an optical fiber coupled to the second optical port such that the second optical beam exiting the monolithic optical module through the second optical port is coupled into the optical fiber.

6. The optical device of claim 1, wherein the monolithic optical module further comprises:
a third optical port aligned with the second internal optical beam dividing interface such that the fourth optical beam exits the monolithic optical module through the third optical port.

7. The optical device of claim 6, wherein the monolithic optical module further comprises:
a fourth optical port aligned with the fifth TIR surface such that the fifth optical beam exits the monolithic optical module through the fourth optical port.

8. The optical device of claim 7, further comprising:
a second monitor photodetector aligned with the fourth optical port, the second monitor photodetector detecting the fifth optical beam when the fifth optical beam exits the monolithic optical module through the fourth optical port.

9. The optical device of claim 6, further comprising:
a first monitor photodetector aligned with the third optical port, the first monitor photodetector detecting the fourth optical beam when the fourth optical beam exits the monolithic optical module through the third optical port.

10. The optical device of claim 1, further comprising:
a light source aligned with the first optical port, the light source emitting the first optical beam that enters the monolithic optical module through the first optical port.

11. An optical device, comprising:
a monolithic optical module that comprises:
a first total internal reflection (TIR) surface;
a second TIR surface adjacent the first TIR surface, an interface between the first TIR surface and the second TIR surface forming a first internal optical beam dividing interface;

a third TIR surface adjacent the second TIR surface;
a fourth TIR surface adjacent the third TIR surface such that the third TIR surface is between the second TIR surface and the fourth TIR surface, an interface between the third TIR surface and the fourth TIR surface forming a second internal optical beam dividing interface, exterior surfaces of the first, the second, the third and the fourth TIR surfaces forming a generally W-shaped contour;
a fifth TIR surface adjacent the fourth TIR surface such that the fourth TIR surface is between the third TIR surface and the fifth TIR surface, exterior surfaces of the second, the third, the fourth TIR and the fifth surfaces forming a generally inverted M-shaped contour.

12. The optical device of claim 11, wherein an optical beam splitting ratio of the monolithic optical module is predetermined according to at least one physical feature of at least one of the first TIR surface, the second TIR surface, and the third TIR surface.

13. The optical device of claim 11, wherein the monolithic optical module further comprises:
a first optical port aligned with the first internal optical beam dividing interface such that when the first optical beam enters the monolithic optical module through the first optical port the first optical beam is incident on the first internal optical beam dividing interface and divided into a second optical beam traveling in a first direction and a third optical beam traveling in a second direction opposite to the first direction;
a second optical port aligned with the first TIR surface such that the second optical beam exits the monolithic optical module through the second optical port; and
a third optical port aligned with the second internal optical beam dividing interface such that a fourth optical beam, which results from a first portion of the third optical beam incident on the second internal optical beam dividing interface and reflected by the third TIR surface, exits the monolithic optical module through the third optical port.

14. The optical device of claim 13, wherein the monolithic optical module further comprises:
a fourth optical port aligned with the fifth TIR surface such that a fifth optical beam, which results from a second portion of the third optical beam incident on and reflected by the fifth TIR surface, exits the monolithic optical module through the fourth optical port.

15. An optical device, comprising:
a monolithic optical module that comprises:
a first total internal reflection (TIR) surface; and
a second TIR surface, wherein:
a first optical beam entering the monolithic optical module through a first surface thereof in an original direction and incident on the first TIR surface is partially reflected by the first TIR surface to travel in a first direction different from the original direction as a second optical beam to exit the monolithic optical module through a second surface thereof that is perpendicular to the first surface such that another portion of the first optical beam is reflected by the second TIR surface to travel in a second direction different from the original and the first directions as a third optical beam while a second portion of the third optical beam is not reflected by the third TIR surface and continues to travel in the second direction.

16. The optical device of claim 15, wherein an optical beam splitting ratio of the monolithic optical module is predetermined according to at least one physical feature of at least one the first TIR surface and the second TIR surface.

17. The optical device of claim 15, wherein the monolithic optical module further comprises:
a first optical port such that the first optical beam is incident on the first TIR surface when the first optical beam enters the monolithic optical module through the first optical port;
a second optical port such that the second optical beam exits the monolithic optical module through the second optical port; and
a third optical port such that the fourth optical beam exits the monolithic optical module through the third optical port.

18. The optical device of claim 17, further comprising:
a light source aligned with the first optical port, the light source emitting the first optical beam that enters the monolithic optical module through the first optical port.

19. The optical device of claim 17, further comprising:
a monitor photodetector aligned with the third optical port, the monitor photodetector detecting the fourth optical beam when the fourth optical beam exits the monolithic optical module through the third optical port.

20. The optical device of claim 17, further comprising:
an optical fiber coupled to the second optical port such that the second optical beam exiting the monolithic optical module through the second optical port is coupled into the optical fiber.

* * * * *